United States Patent [19]
Nepple

[11] Patent Number: 5,684,411
[45] Date of Patent: Nov. 4, 1997

[54] SELF-CONFIGURING BUS

[75] Inventor: Bruce C. Nepple, Portland, Oreg.

[73] Assignee: Seiko Communications Systems, Inc., Beaverton, Oreg.

[21] Appl. No.: 542,763

[22] Filed: Oct. 13, 1995

[51] Int. Cl.[6] .................................................. H03K 19/0175
[52] U.S. Cl. ........................... 326/38; 326/33; 326/86
[58] Field of Search .............................. 326/21, 33, 38, 326/86

[56] References Cited

U.S. PATENT DOCUMENTS

| | | | |
|---|---|---|---|
| 5,051,622 | 9/1991 | Pleva | 326/38 |
| 5,111,079 | 5/1992 | Steele | 326/38 |
| 5,426,378 | 6/1995 | Ong | 326/38 X |
| 5,432,465 | 7/1995 | Hsi-Jung et al. | 326/86 X |

*Primary Examiner*—David R. Hudspeth
*Attorney, Agent, or Firm*—Elmer Galbi

[57] ABSTRACT

Integrated circuit design contemplating alternate applications incorporates devices, e.g. a gatable pull-down FET resistor, responsive to signal activity at an integrated circuit pin. Signal activity, as opposed to traditional configuration mechanisms, dictates integrated circuit functions including level-pulling functions and bus configuration functions.

5 Claims, 5 Drawing Sheets

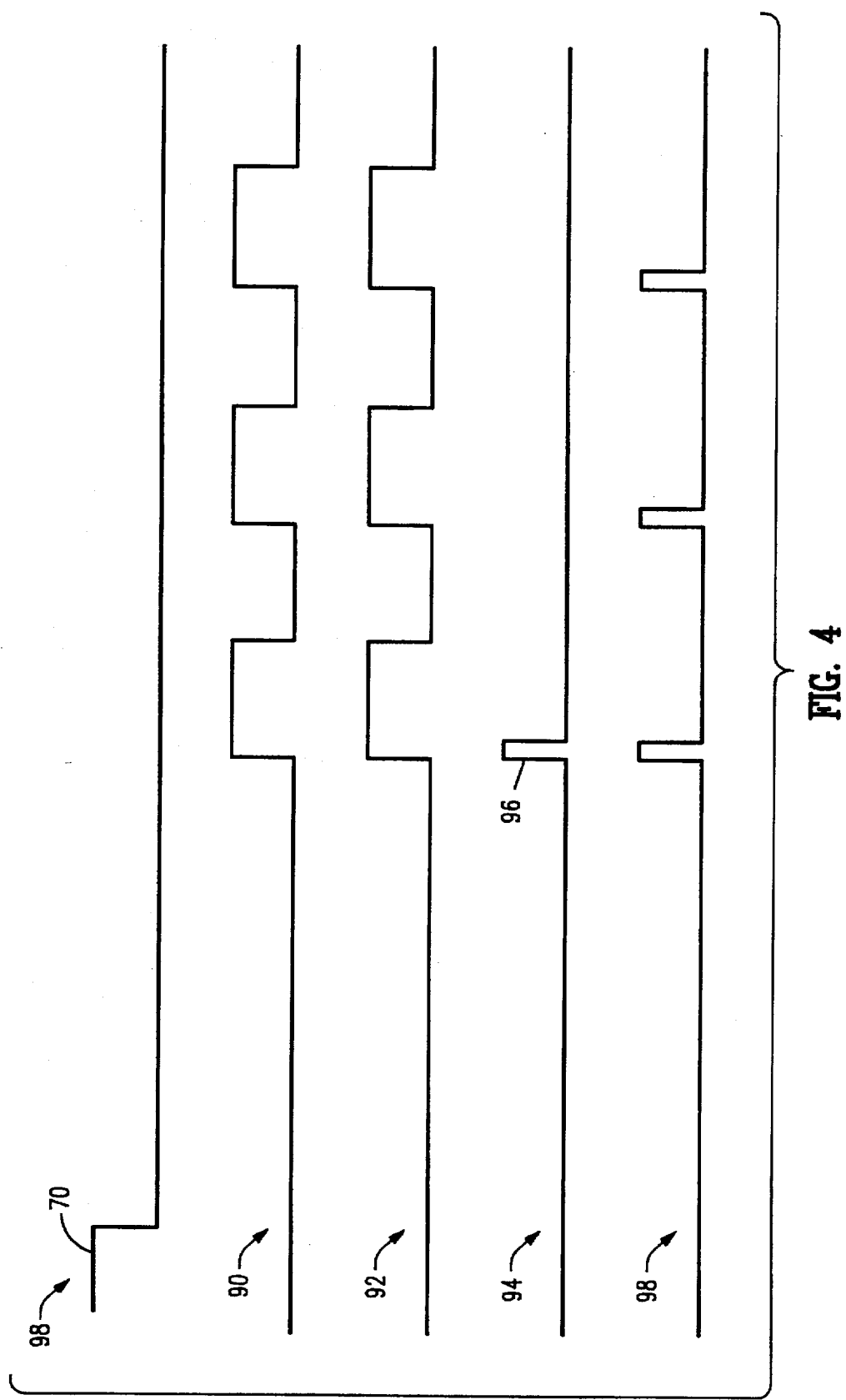

SELF-CONFIGURING BUS

FIELD OF THE INVENTION

The present invention relates generally to integrated circuit design and use, and in particular to integrated circuit design contemplating alternate uses or applications for a given integrated circuit design.

BACKGROUND OF THE INVENTION

Some applications of an IC may use certain IC pins, i.e. points of electrical contact for signal exchange between the IC device and an external device, while other applications of the same IC may not need these same IC pins. The subject matter of the present application concerns circuitry in an IC coupled to IC pins potentially not used in some contemplated applications of the IC device.

IC pins (such as IC pins for a high impedance logic signal input function) which are not connected to an external logic signal may tend to oscillate or cause excessive power consumption if not pulled to a stable logic signal state that is undriven or floating logic signal inputs are prone to oscillate or cause high current consumption especially in CMOS input buffers. Such oscillation or current consumption consumes unnecessary power and potentially disrupts other IC circuit signal processing.

A traditional solution to oscillation of floating logic input IC pins incorporates a "pull-up" or "pull-down" resistor coupled between the input IC pin and a positive or ground, respectively, potential. The level-pulling device, e.g., a pull-up or pull-down resistor, pulls the input IC pin to a given logic state to repress oscillation. When the input IC pin is not used, i.e., the IC device is used in an application not requiring that particular IC pin, no oscillation occurs. If a particular IC pin is used, (i.e., coupled to an external device in a given application), an input signal at the IC pin must overcome the level-pulling device when driving the IC pin to a state opposite that established by the level-pulling device.

In extremely low power consumption applications, use of such level-pulling devices represents undesirable power consumption. Current drawn by the level-pulling device can be significant in extremely low power consumption applications. Accordingly, a level-pulling function should be established only when needed, and disabled at other times.

A high resistance field effect transistor (FET) having a small, long channel serves as "gatable" pull-down or pull-up resistor. A configuration device, such as a mask or data register, drives the gate of the FET to selectively establish or disable the level-pulling function of the FET. Use of the input IC pin must, however, be known at the time of manufacture, for the case of a mask-driven configuration device, or at the time of configuration, for the case of a data register-driven configuration device. If, following configuration in level-pulling mode, an input signal is applied to the input IC pin, the IC pin is undesirably in a level-pulling mode and excess power is devoted to overcoming the level-pulling device.

Integrated circuits communicate with external devices through a bus coupled to a set of bus pins of the integrated circuit. Possible bus definitions include a multiplexed bus, where a set of conductors or IC pins alternately carry both address and data signals, and a parallel bus where address and data signals appear on separate conductors. Generally, integrated circuit design contemplates alternate bus applications by dedicating a set of IC pins to bus communication and including circuitry implementing at a given time one or the other bus definition. The integrated circuit further includes a "configuration pin" separate from bus communication pins and driven by an external device. When the integrated circuit is placed in operation in a given application, i.e., coupled to a specific type of bus, a conductor of the bus drives the "configuration pin" and dictates integrated circuit operation, i.e., bus communication. Important to note, bus communication cannot occur until the configuration pin is driven and the integrated circuit is configured for the particular bus definition. Thus, a special IC pin must be dedicated to bus configuration and such pin must be configured at initialization of the integrated circuit.

It would be desirable to establish an integrated circuit function when needed and disable the function when not needed without requiring establishment or disablement of the function at the time of manufacture or initial integrated circuit configuration or operation.

SUMMARY OF THE INVENTION

An integrated circuit having a self-configuring bus under the present invention includes a set of pins dedicated to bus communication. Bus interface circuitry coupled to the set of pins implements a first and second bus configuration wherein the interface circuitry responds to an internal configuration signal dictating operation according to the of said first and second bus configurations. Bus communication signal responsive circuitry couples to at least one member of the set of pins and provides the internal configuration signal.

In an integrated circuit adapted under the present invention for communication selectively on one of a first and second bus configuration, bus interface and configuration circuitry includes signal detection circuitry responsive to bus communication signal activity at first and second integrated circuit pins. The first integrated circuit pin is used in the first bus configuration and the second integrated circuit pin is used in the second bus configuration. The detection circuitry produces a configuration signal indicating detected signal activity at one of the first and second pins. Interface circuitry responsive to the configuration signal establishes communication according to one of the first and second bus configurations.

A method of bus configuration under the present invention for an integrated circuit designed for use on one of a first and second bus configuration begins with detecting bus communication signal activity at an integrated circuit pin used for bus communication on the first bus configuration and not used on the second bus configuration. The method then drives in response to the detecting step bus interface circuitry to allow integrated circuit operation on one of the first and second bus configurations, The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which:

FIG. 4 illustrates signal waveforms including an input logic signal and corresponding waveforms representing current drawn in a traditional level-pulling device, the level-pulling device of FIG. 2, and the level-pulling device of FIG. 3.

DETAILED DESCRIPTION OF THE PREFERRED EMBODIMENT

Figure 1:
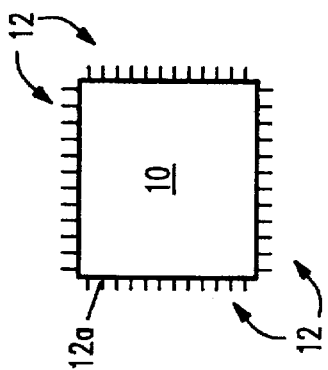
FIG. 1 illustrates an integrated circuit (IC) device including pins used in only some intended applications for the IC device.

FIG. 1 illustrates an integrated circuit (IC) device 10 including about its periphery a plurality of pins 12 establishing electrical signal paths between integrated circuit 10 and external devices, not shown. With regard to the present disclosure, integrated circuit 10 includes certain ones of pins 12 which may or may not be used in a given selected application or use of integrated circuit 10. Pin 12a represents one of such pins 12. Pin 12a includes a logic signal input function which may or may not be relevant to a selected application for integrated circuit 10. If pin 12a is not used in a selected application for integrated circuit 10, pin 12a is unconnected or undriven relative to an external device. Pin 12a may, therefore, be considered a floating input of integrated circuit 10. Such floating or undriven inputs must be pulled to a stable logic value to avoid oscillation thereof.

Figure 2:
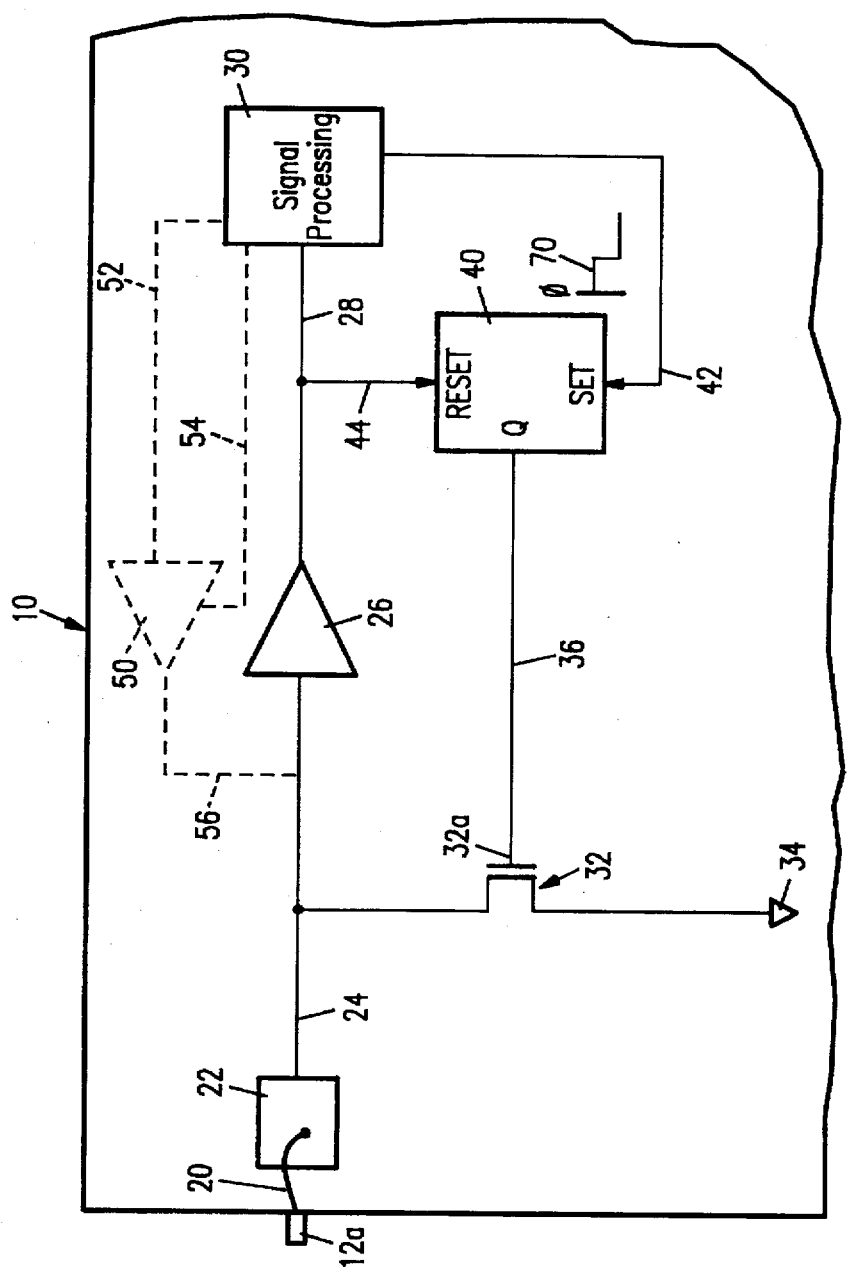
FIG. 2 illustrates, partially and in block diagram, circuitry internal to the IC device of FIG. 1 including circuitry relative to a potentially unused pin of the IC.

FIG. 2 illustrates level-pulling circuitry of integrated circuit 10 relative to pin 12a. In FIG. 2, a bond wire 20 electrically couples pin 12a to a bond pad 22 of integrated circuit 10. Conductor 24 couples pad 22 to an input buffer 26. Conductor 28 couples the output of input buffer 26 to control and signal processing circuitry 30, not detailed herein but representing the remaining circuitry of integrated circuit 10. A high resistance field effect transistor (FET) 32 couples conductor 24 to a selected electrical potential, i.e., ground potential 34. FET 32 establishes or disables a level-pulling function relative to pin 12a.

A logic signal delivered via conductor 36 at FET gate 32a establishes or disables the level-pulling function of FET 32. In a first state, such logic signal establishes a level-pulling function by "closing" FET 32, i.e., given magnitude resistance between conductor 24 and potential 34. In a second state, the logic signal applied to gate 32a "opens" FET 32 and presents a very high magnitude resistance between conductor 24 and potential 34 thereby disabling the level-pulling function of FET 32.

Integrated circuit 10 includes a flip-flop register 40, responsive to signal activity at pin 12a, to drive the gate 32a of FET 32. As used herein "signal activity" refers to an external signal driving a level-pulling device in a direction opposite that established thereby. Conductor 36 couples the Q output of register 40 to gate 32a of FET 32. Register 40 includes a SET input and a RESET input. A conductor 42 couples to the SET input of register 40 to establish initialization of register 40. A conductor 44, couples conductor 28 and the RESET input of register 40 to drive register 40 dynamically during operation of integrated circuit 10 and thereby selectively establish or disable a FET 32 level-pulling function.

In operation, circuitry 30 initially drives conductor 42 with a pulse 70 of sufficient duration to set register 40, i.e., close FET 32, and establish a level-pulling function. As may be appreciated, pulse 70 could also originate from "off-chip", e.g., a global reset signal applied to several integrated circuits in addition to circuit 10. Register 40 maintains the level-pulling function at FET 32 by maintaining, in the particular arrangement illustrated, a logic value one on conductor 36. Thus, so long as pin 12a is unused, i.e., unconnected to an external signal, the level-pulling function remains and oscillation at pin 12a is repressed.

If, however, pin 12a is driven by an external signal, the circuitry illustrated in FIG. 2 automatically disables the level-pulling function provided by FET 32. More particularly, when a signal applied to pin 12a is opposite that established by the level-pulling function, then the signal present at conductors 28 and 44 asserts the RESET input of register 40 and thereby changes to a logic value zero the logic state applied to gate 32a of FET 32. Thus, when a signal applied to pin 12a drives pin 12a in a logic state opposite that of the level-pulling function, register 40 opens FET 32 to disable the level-pulling function. Thereafter, signal activity at pin 12a need not overcome a level-pulling function and power is conserved.

Also illustrated in FIG. 2, pin 12a may be an input/output pin by further incorporation of an output buffer 50 having a signal input conductor 52 and an output enable conductor 54 applied thereto. A conductor 56 couples the output of buffer 50 to conductor 24, thereby allowing signal processing circuitry 30 to selectively drive pin 12a.

Thus, integrated circuit 10 may be designed for a variety of applications, some of which may make use of pin 12a. To avoid oscillation at pin 12a when unconnected to an external device, the level-pulling function of FET 32 is enabled. At other times, i.e., when pin 12a is connected to an external device, FET 32 is disabled as a function of activity, i.e., logic signal activity, at pin 12a. In this manner, establishing or disabling a level-pulling function need not be determined at the time of integrated circuit 10 manufacture or initial configuration. Integrated circuit 10 dynamically responds to signal activity at pin 12a to selectively establish or disable the desired level-pulling function.

Figure 3:
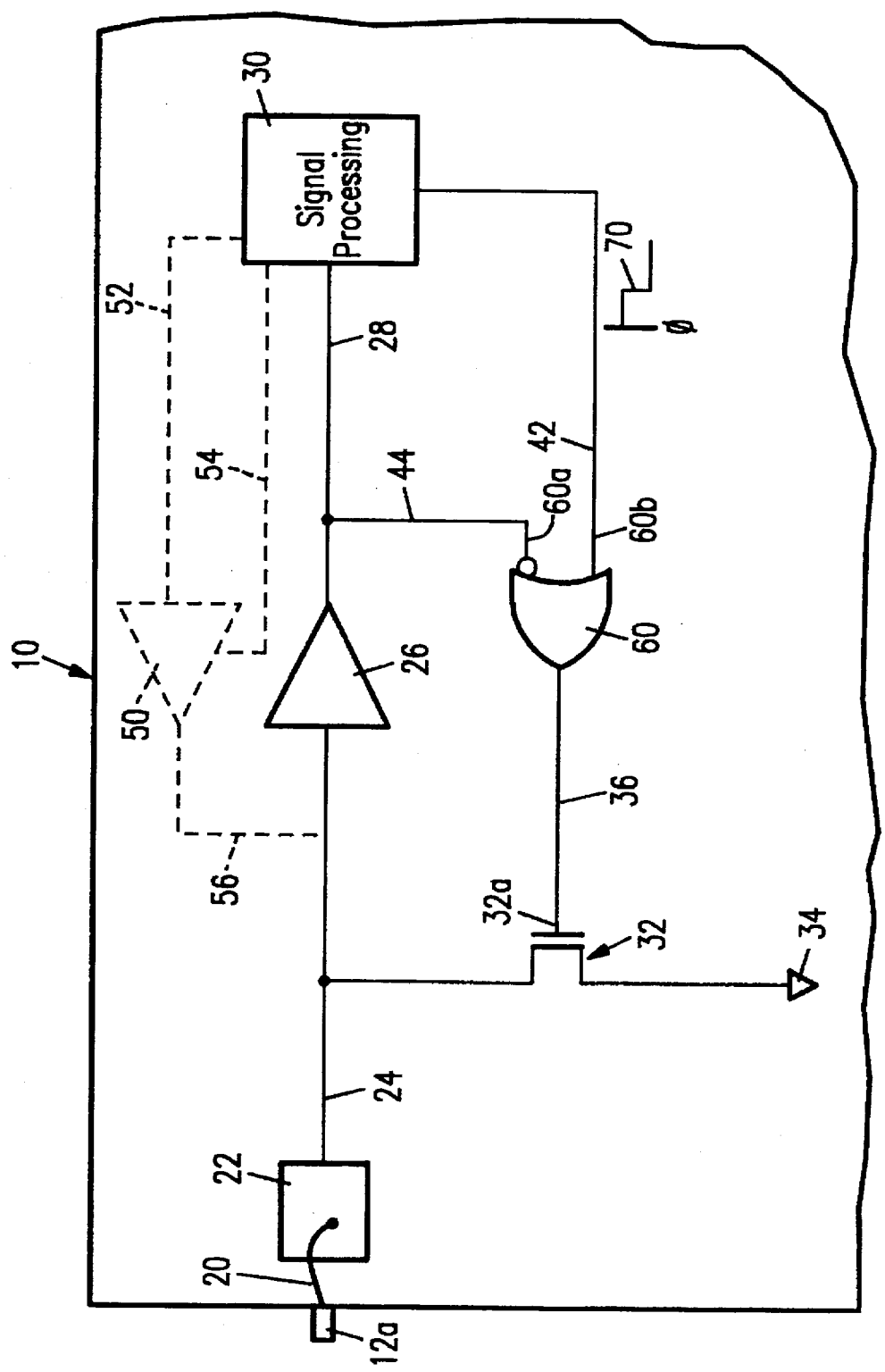
FIG. 3 is an alternative circuit relative to that shown in FIG. 2.

FIG. 3 illustrates an alternative mode-driving device, i.e., a mechanism driving FET 32 as a function of signal activity at pin 12a. In FIG. 3, register 40 is replaced with an OR gate 60. Conductor 36 couples the output of OR gate 60 to gate 32a of FET 32. Conductor 44 connects to an inverting input 60a of OR gate 60. Conductor 42 connects to a non-inverting input 60b of OR gate 60.

In operation of the circuitry of FIG. 3, signal processing circuitry 30 provides an initial pulse 70 at conductor 42 to establish a level-pulling function at FET 32. More particularly, pulse 70 is of sufficient duration to cause FET 32 to close, thereby pulling the logic state at conductor 24, buffer 26, and conductors 28 and 44 to a logic zero condition. Such logic zero condition at conductor 44, i.e., the inverting input of OR gate 60, maintains FET 32 in its level-pulling mode. FET 32 remains in a level-pulling mode until a signal applied at pin 12a drives the logic state of conductor 24 in an opposite direction. More particularly, a logic value one arriving at pin 12a causes FET 32 to open, following inherent delay in elements 26, 40, and 32, thereby disabling the level-pulling function. The level-pulling function remains disabled until the signal applied to pin 12a again returns to a logic value zero.

FIG. 4 illustrates waveforms representative of the circuitry of FIGS. 2 and 3. In FIG. 4, waveform 98 represents the initial pulse 70 establishing a level-pulling function. Waveform 90 corresponds to an logic input signal provided by an external device at pin 12a. Waveform 92 represents current drawn through a traditional level-pulling device, e.g., a pull-down resistor. Significant current passes through the traditional level-pulling device, i.e., during each occurrence of a logic value one in the waveform 90. Waveform 94 illustrates current drawn through FET 32 according to the arrangement illustrated in FIG. 2. A single pulse 96 of current passes through FET 32 upon the first occurrence of a logic value one presentation in waveform 90, i.e., at the first rising edge in waveform 90. Waveform 98 corresponds to current drawn through FET 32 under the arrangement illustrated in FIG. 3. Waveform 98 illustrates multiple occurrences of current passage through FET 32, i.e., one for each rising edge in the input waveform 90. Waveforms 94 and 98 illustrate a power conservation under the present invention relative to traditional level-pulling devices.

Thus, the present invention provides, for unconnected IC pins, a mechanism and method automatically disabling a level-pulling device to reduce the overall current consumed while repressing oscillation at a floating input pin of an integrated circuit. FET 32 is initially placed in a level-pulling mode to maintain a first logic state at the IC pin. However, if a second logic state signal is forced upon the pin, overcoming the level-pulling function, then circuitry of the present invention automatically disables the level-pulling function. This conserves power otherwise consumed in overcoming the level-pulling device, i.e., conserves power otherwise consumed in driving the input pin to a state opposite that established by a level-pulling device.

While signal activity at the IC pin drives the level-pulling mode, other control schemes may be used in addition such as returning to a level-pulling mode following a given period of signal inactivity or by control circuitry resetting register 40 during a reset procedure of integrated circuit 10.

Figure 5A:
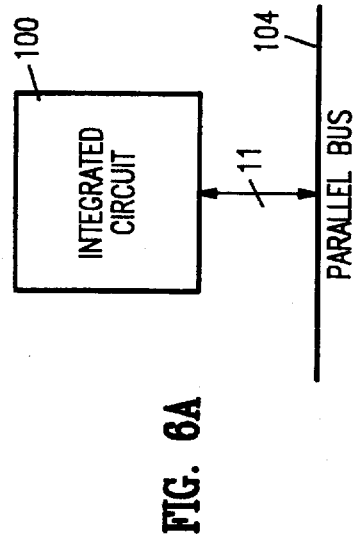
FIGS. 5A and 5B illustrate application of an integrated circuit to a multiplexed A/D bus and integrated circuit pin assignments under such application.
Figure 6A:
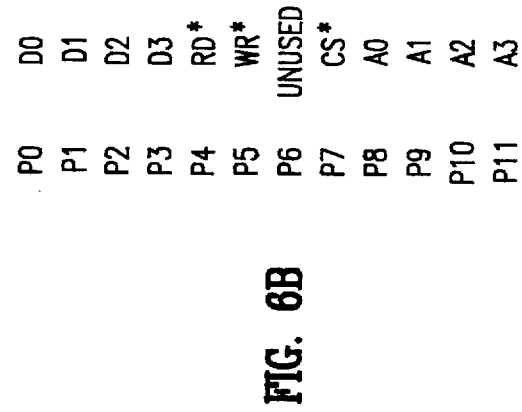
FIGS. 6A and 6B illustrated the integrated circuit of FIG. 5A, but applied to a parallel bus and integrated circuit pin assignments under such application.

FIGS. 5A and 6A illustrate alternative bus configurations for an integrated circuit 100. In FIG. 5A, integrated circuit 100 couples to a multiplexed address/data (A/D) bus 102. In FIG. 6A, integrated circuit 100 couples to a parallel bus 104. Multiplexed A/D busses use fewer pins by alternately sending both address and data signals on one set of pins. Parallel busses dedicate separate pin sets to data and address information. Interaction between integrated circuit 100 and multiplexed A/D bus 102 requires seven conductors, i.e., requires seven IC pins of integrated circuit 100. Interaction between integrated circuit 100 and parallel bus 104 requires eleven conductors, i.e., IC pins.

Under the present invention, integrated circuit 100 reacts to a given application, i.e., coupling to one of busses 102 and 104, by automatically configuring its operation for communication on appropriate ones of its IC pins. Normally, a "configuration pin" must be dedicated to a bus configuration function. In other words, an external device must first drive an integrated circuit at its configuration pin, indicating the type of bus to which it is connected, before any bus activity occurs. Under the present invention, however, no configuration pin need be dedicated to bus configuration. The present invention allows an external device to simply begin communication via a particular form of bus, and integrated circuit 100 reacts to such communication, i.e., appropriately responds according to detected signal activity.

Figure 5B:
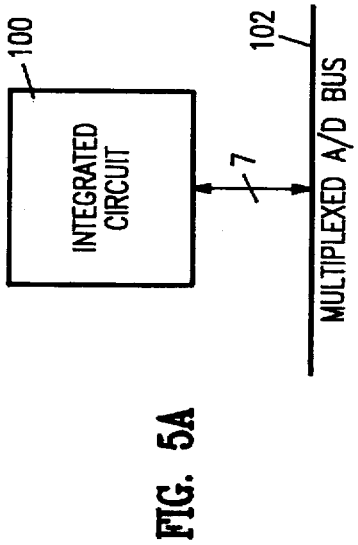
Figure 6B:

FIGS. 5B and 6B illustrated pin assignments 106 and 108 for integrated circuit 100 relative to the multiplexed A/D bus 102 and parallel bus 104, respectively. Each of FIGS. 5B and 6B illustrate pin assignments for the same set of integrated circuit 100 IC pins, i.e., pins P0–P11. Under integrated circuit 100 design, pins P0–P11 are dedicated to bus interaction and may be used for either multiplexed or parallel bus interaction. Pins P4 and P5 share assignments under multiplexed pin assignment 106 and parallel pin assignment 108, i.e., read and write control, respectively.

In FIG. 5B, pins P0–P3 carry multiplexed address and data bits, in particular bits A/D0–A/D3. Pins P4 and P5 carry read and write control signals. Pin P6 receives an address latch enable (ALE) signal. Pins P7–P11 are unused with respect to interaction on multiplexed A/D bus 102.

In FIG. 6B, pins P0–P3 are dedicated exclusively to data, i.e. data bits D0–D3. Pins P4 and P5 carry read and write, respectively, signals. Pin 6 is unused. Pin P7 carries a chip select (CS*) signal. Pins P8–P11 carry address bits A0–A3.

The address latch enable (ALE) signal is unique to a multiplexed A/D bus 102 application while the chip select (CS*) signal is unique to the parallel bus 104 application. Under the multiplexed pin assignment 106, pin P6 carries the address latch enable (ALE) signal, but under the parallel pin assignment 108 pin P6 is unused. Signal activity at pin P6 indicates coupling of integrated circuit 100 to multiplexed A/D bus 102. Signal activity at pin P7 indicates coupling of integrated circuit 100 to parallel bus 104.

Figure 7:
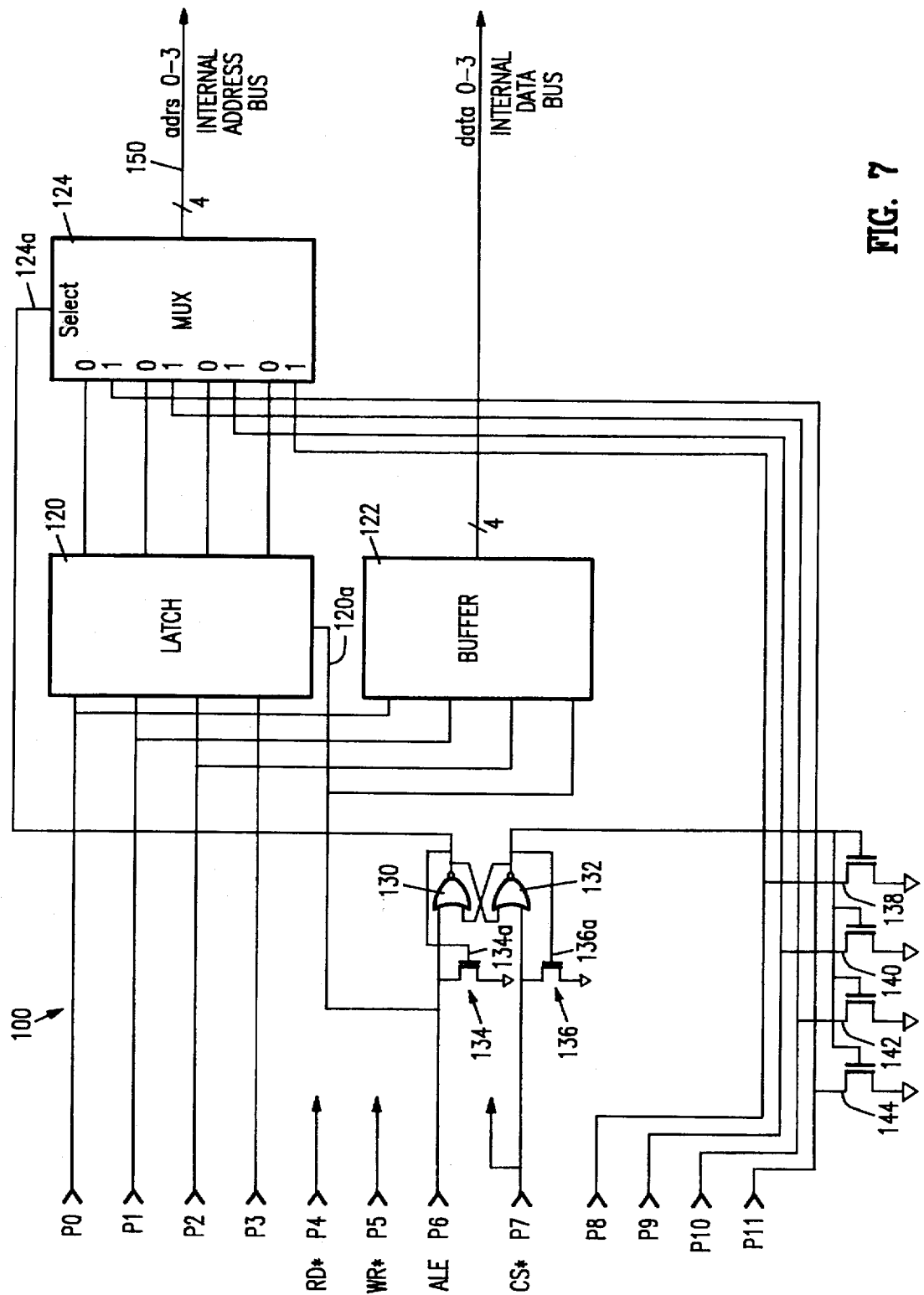
FIG. 7 illustrates in block diagram circuitry establishing a self-configuring bus interface for the integrated circuit of FIGS. 5A and 6A.

FIG. 7 illustrates by block diagram circuitry of integrated circuit 100 coupled to pins P0–P11. In FIG. 7, pins P0–P3, carrying both address and data signals under pin assignment 106 but only data signals under pin assignment 108, connect to a four bit latch 120 and a four bit buffer 122. Latch 120 provides its four bit output to multiplexor 124, in particular to a first input set, designated "0", for multiplexor 124. Pins P8–P11 apply to the second input set, designated "1", of multiplexor 124. Accordingly, a select input 124a controls which of the input sets appear as multiplexor 124 output.

NOR gate 130 connects at its first input to pin P6, and thereby receives when present the address latch enable (ALE) signal from multiplexed A/D bus 102. NOR gate 132 receives at its first input the chip select (CS*) signal from parallel bus 104. The second input for NOR gate 130 receives the output of NOR gate 132 while the second input of NOR gate 132 receives the output of NOR gate 130. Because either one of pins P6 and P7 are potentially unused, each requires use of a level-pulling device. FET 134 couples pin P6 to ground potential and FET 136 couples pin P7 to a ground potential. The output of NOR gate 130 drives gate 134a of FET 134 while the output of NOR gate 132 drives the gate 136a of FET 136.

An asserted address latch enable signal (ALE), indicating connection to multiplexed A/D bus 102, causes the output of NOR gate 130 to go low, opens FET 134, and thereby disables a level-pulling function at pin P6. Similarly, a chip select (CS*) signal opens FET 136 and thereby disables a level-pulling function at pin P7. Level-pulling functions applied to pins P6 and P7 are complimentary, i.e., when FET 134 is closed, FET 136 is open and when FET 134 is open FET 136 is closed. Furthermore, signal activity at P6, indicating connection to multiplexed bus 102, indicates need for a level-pulling function at pins P8–P11, unused under multiplexed pin assignment 106. FETs 138, 140, 142, and 144 tie unused pins P8–P11, respectively, to ground potential. The gates for FETs 138, 140, 142, and 144 are tied in common to the output of NOR gate 132. Signal activity at pin P7 opens FETs 138, 140, 142, and 144 to disable a level-pulling function thereat. Similarly, signal activity at P6 closes FETs 138, 140, 142, and 144 establishes a level-pulling function as required under multiplexed pin assignment 106. Pin P6 couples directly to a control input 120a of latch 120. When the address latch enable (ALE) signal is asserted, latch 120 is transparent, i.e., passes data to multiplexor 124. When the address latch enable (ALE) signal is not asserted, latch 120 captures and holds address data.

The level-pulling devices are initialized by one of the chip select (CS*) or address latch enable (ALE) signals being activated, i.e., provided by an external device coupled to integrated circuit 100. Signal activity at pin P6, i.e., the address latch enable (ALE) signal, causes multiplexor 124 to select its input from pins P0–P3 via latch 120. Signal activity at pin P7, the chip select (CS*) signal, causes multiplexor 124 to select its input from pins P8–P11. In this manner, an internal address bus 150 carries address data taken from latch 120 connects to pins P0–P3 when connected to multiplexed A/D bus 102 and pins P8–P11 when connected to parallel bus 104.

Integrated circuit 100 as shown implements incoming communication and the self-configuring response to such incoming communication. While not illustrated herein, additional components of integrated circuit 1 00 establish outgoing communication relative to a bi-directional parallel or multiplexed bus.

Thus, a self-configuring bus has been shown for an integrated circuit. The arrangement conserves one integrated circuit pin by eliminating a bus configuration pin and conserves power by disabling a level-pulling function when not needed. Under the illustrated embodiment, if the address latch enable (ALE) signal is asserted then integrated circuit 100 configures itself for operation on multiplexed A/D bus 102. If the chip select (CS*) signal is deasserted, integrated circuit 100 configures itself for operation on parallel bus 104. In addition to self configuration, the arrangement shown herein automatically establishes appropriate level-pulling relative to unused pins for a given application. Thus, when integrated circuit 100 configures itself for operation on multiplexed A/D bus 102 level-pulling functions are established at pins P7–P11. Similarly, when integrated circuit 100 configures itself for operation on parallel bus 104, level-pulling functions at pins P7–P11 are disabled and a level-pulling function at pin P6 is established. In this manner, energy required to overcome a level-pulling device is conserved.

It will be appreciated that the present invention is not restricted to the particular embodiment that has been described and illustrated, and that variations may be made therein without departing from the scope of the invention as found in the appended claims and equivalents thereof. For example, while a chip select pin was shown herein as an indicator of connection to a particular bus, other integrated circuit pins may be used. A reset pin can be coupled to the input of NOR gate 132 whereby upon reset a parallel bus configuration results and upon assertion of the ALE signal at P6 a multiplexed bus configuration results.

What is claimed is:

1. An integrated circuit comprising:
a set of pins dedicated to bus communication;
bus interface circuitry coupled to said set of pins, said bus interface circuitry implementing a first and second bus configuration, said interface circuitry being responsive to an internal configuration signal dictating operation according to one of said first and second bus configurations;
bus communication signal responsive circuitry coupled to at least one of said set of pins and providing said configuration signal; and
wherein said first and second bus configurations are multiplexed and parallel, respectively.

2. An integrated circuit comprising:
a set of pins dedicated to bus communication;
bus interface circuitry coupled to said set of pins, said bus interface circuitry implementing a first and second bus configuration, said interface circuitry being responsive to an internal configuration signal dictating operation according to one of said first and second bus configurations;
bus communication signal responsive circuitry coupled to at least one of said set of pins and providing said configuration signal; and
wherein said signal responsive circuitry couples to first and second ones of said set of pins, said first pin being used under said first bus configuration and not used under said second bus configuration, said second pin being used under said second bus configuration and not used under said first bus configuration.

3. An integrated circuit comprising:
a set of pins dedicated to bus communication;
bus interface circuitry coupled to said set of pins, said bus interface circuitry implementing a first and second bus configuration, said interface circuitry being responsive to an internal configuration signal dictating operation according to one of said first and second bus configurations;
bus communication signal responsive circuitry coupled to at least one of said set of pins and providing said configuration signal; and
wherein a first pin subset of said set of pins is used under said first bus configuration and not used under said second bus configuration, each member of said first pin subset being coupled to a level-pulling device, each level pulling device being responsive to said configuration signal to establish a level-pulling function at each member of said first pin subset when said integrated circuit is configured for operation according to said second bus configuration.

4. In an integrated circuit adapted for communication selectively on one of a first and second bus configuration, bus interface and configuration circuitry comprising:
signal detection circuitry responsive to bus communication signal activity at first and second integrated circuit pins, said first integrated circuit pin being used in said first bus configuration, said second integrated circuit pin being used in said second bus configuration, said detection circuitry producing a configuration signal indicating detected signal activity at one of said first and second pins; and
interface circuitry responsive to said configuration signal to establish communication according to one of said first and second bus configurations.

5. Bus interface and configuration circuitry according to claim 4 wherein said integrated circuit includes a pin set used for communication according to said first bus configuration and not used for said second bus configuration, each member of said pin set being coupled to a gatable level-pulling device, each level-pulling device being responsive to said configuration signal to establish a level-pulling function at the associated pin when said integrated circuit is configured for operation on said second bus configuration.

* * * * *